(12) United States Patent
Meline et al.

(10) Patent No.: US 11,431,333 B2
(45) Date of Patent: Aug. 30, 2022

(54) MONITOR CIRCUIT FOR MONITORING A LIGHTNING PROTECTION COMPONENT

(71) Applicant: SAFRAN ELECTRONICS & DEFENSE, Boulogne Billancourt (FR)

(72) Inventors: Olivier Meline, Boulogne-Billancourt (FR); François Guillot, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 17/356,915

(22) Filed: Jun. 24, 2021

(65) Prior Publication Data

US 2021/0328583 A1    Oct. 21, 2021

Related U.S. Application Data

(62) Division of application No. 16/955,609, filed as application No. PCT/EP2018/084512 on Dec. 12, 2018, now Pat. No. 11,063,584.

(30) Foreign Application Priority Data

Dec. 18, 2017 (FR) ...................................... 1762379

(51) Int. Cl.
  *H02M 1/00* (2006.01)
  *G05F 1/00* (2006.01)
  (Continued)

(52) U.S. Cl.
  CPC ......... *H03K 17/0822* (2013.01); *G01R 1/203* (2013.01); *G01R 1/30* (2013.01);
  (Continued)

(58) Field of Classification Search
None
See application file for complete search history.

(56) References Cited

U.S. PATENT DOCUMENTS 5,335,162 A    8/1994  Martin-Lopez et al.
6,246,222 B1   6/2001  Nilles et al.
(Continued)

FOREIGN PATENT DOCUMENTS

EP    2747285 A1   6/2014
FR    2838891 A1   10/2003
(Continued)

*Primary Examiner* — Kenneth B Wells
(74) *Attorney, Agent, or Firm* — Muncy, Geissler, Olds & Lowe, P.C.

(57) ABSTRACT

A switching circuit comprising a transistor (23) and a drive component both for controlling the transistor and also for limiting the power supply current (Ia) supplied to a load (22), the drive component being arranged both to receive a control voltage ($V_H$) and also:

when the control voltage (VH) is disconnection signal, to generate a drive voltage ($V_p$) that causes the transistor to occupy a non-conductive state;

when the control voltage (VH) is a connection signal and the power supply current (Ia) cannot reach a predefined current threshold, to generate drive voltage ($V_p$) that causes the transistor to occupy saturated conditions; and when the control voltage (VH) is a connection signal and the power supply current (Ia) can reach a predefined current threshold, to generate a drive voltage ($V_p$) that causes the transistor to occupy linear conditions, such that the power supply current is regulated so that it does not exceed the predefined current threshold.

7 Claims, 7 Drawing Sheets

(51) Int. Cl.
*H03K 17/082* (2006.01)
*G01R 1/20* (2006.01)
*G01R 1/30* (2006.01)

(52) U.S. Cl.
CPC .............. *H03K 2217/0027* (2013.01); *H03K 2217/0072* (2013.01)

(56) References Cited

U.S. PATENT DOCUMENTS

| | | |
|---|---|---|
| 6,480,043 B2 | 11/2002 | Hall et al. |
| 6,801,419 B2 | 10/2004 | Fukui |
| 6,946,821 B2 | 9/2005 | Hamon et al. |
| 7,173,405 B2 | 2/2007 | Bo et al. |
| 7,969,134 B2 | 6/2011 | Chen |
| 2014/0306714 A1* | 10/2014 | Hess ................ H02H 9/041 361/111 |
| 2016/0322807 A1* | 11/2016 | Milkie .............. G01R 31/2827 |

FOREIGN PATENT DOCUMENTS

| | | |
|---|---|---|
| GB | 2267003 A | 11/1993 |
| KR | 100657872 B1 | 12/2006 |
| WO | WO-2017175326 A1 | 10/2017 |

\* cited by examiner

MONITOR CIRCUIT FOR MONITORING A LIGHTNING PROTECTION COMPONENT

CROSS REFERENCE TO RELATED APPLICATIONS

This application is a Divisional of co-pending application Ser. No. 16/955,609, filed on Jun. 18, 2020, now U.S. Pat. No. 11,063,584, for which priority is claimed under 35 U.S.C. § 120; and this application claims priority of Application No. 1762379 filed in France on Dec. 18, 2017 under 35 U.S.C. § 119, the entire contents of all of which are hereby incorporated by reference.

OBJECT OF THE INVENTION

An object of the invention is to monitor a lightning protection component, without destroying components of the calculation means.

BACKGROUND OF THE INVENTION

Certain calculation means, in particular in the field of aviation, make use of a function known as discrete switch output (DSO). The DSO function makes it possible, from a discrete output of the calculation means, to switch a cold point of a load to electrical ground, which load has a hot point connected to a power supply network.

The load comprises equipment that is to be powered, e.g. a solenoid valve. The power supply network supplies a power supply voltage, e.g. a direct current (DC) voltage equal to 28 volts (VDC).

The calculation means thus include a switching circuit connected to the discrete output and arranged to act selectively either to cause the discrete output to be open circuit or else to be connected to the electrical ground.

The DSO function is generally associated with a limiter function for limiting the power supply current supplied to the load. The limiter function is performed by a limiter circuit that ensures that the power supply current does not exceed a predefined current threshold.

Figure 1:
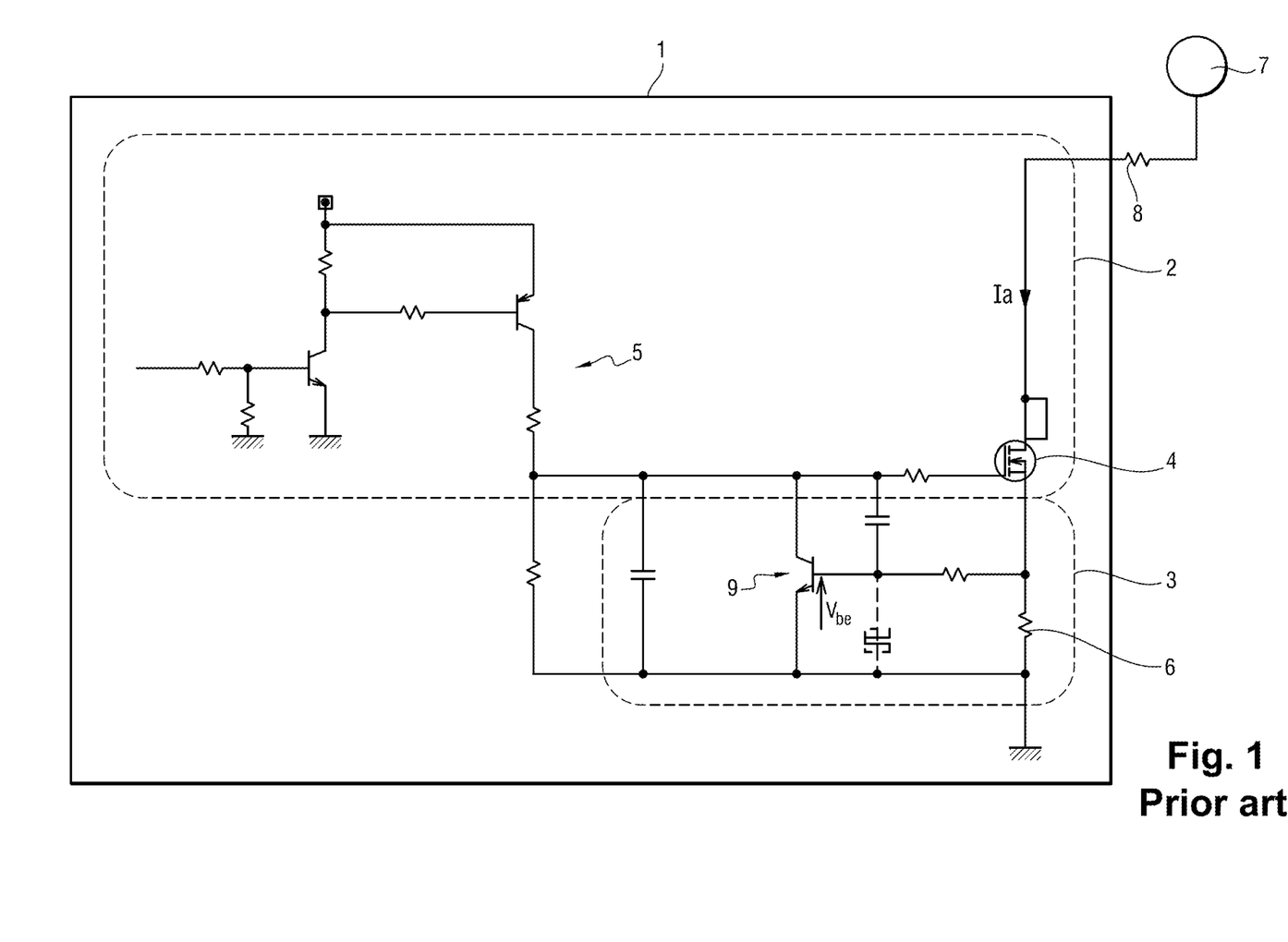
FIG. 1 shows a switching circuit and a limiter circuit in a first prior art solution.

FIG. 1 shows prior art calculation means 1 including a switching circuit 2 and a limiter circuit 3.

The switching circuit 2 comprises a transistor 4 of metal oxide on silicon field effect transistor (MOSFET) type together with drive components 5 that control the transistor 4. The limiter circuit 3 comprises a measuring resistor, or "shunt", 6 having terminals across which a measurement voltage is established that is proportional to the power supply current Ia supplied to the load 8 by the power supply network 7.

The main drawback of that first solution is that the predefined current threshold is very highly dependent on the transistor 9 that performs current limiting, and in particular on temperature variations in the characteristics of said transistor 9. The predefined current threshold is thus generally determined with accuracy of about ±50%, which can be penalizing in certain applications.

Figure 2:
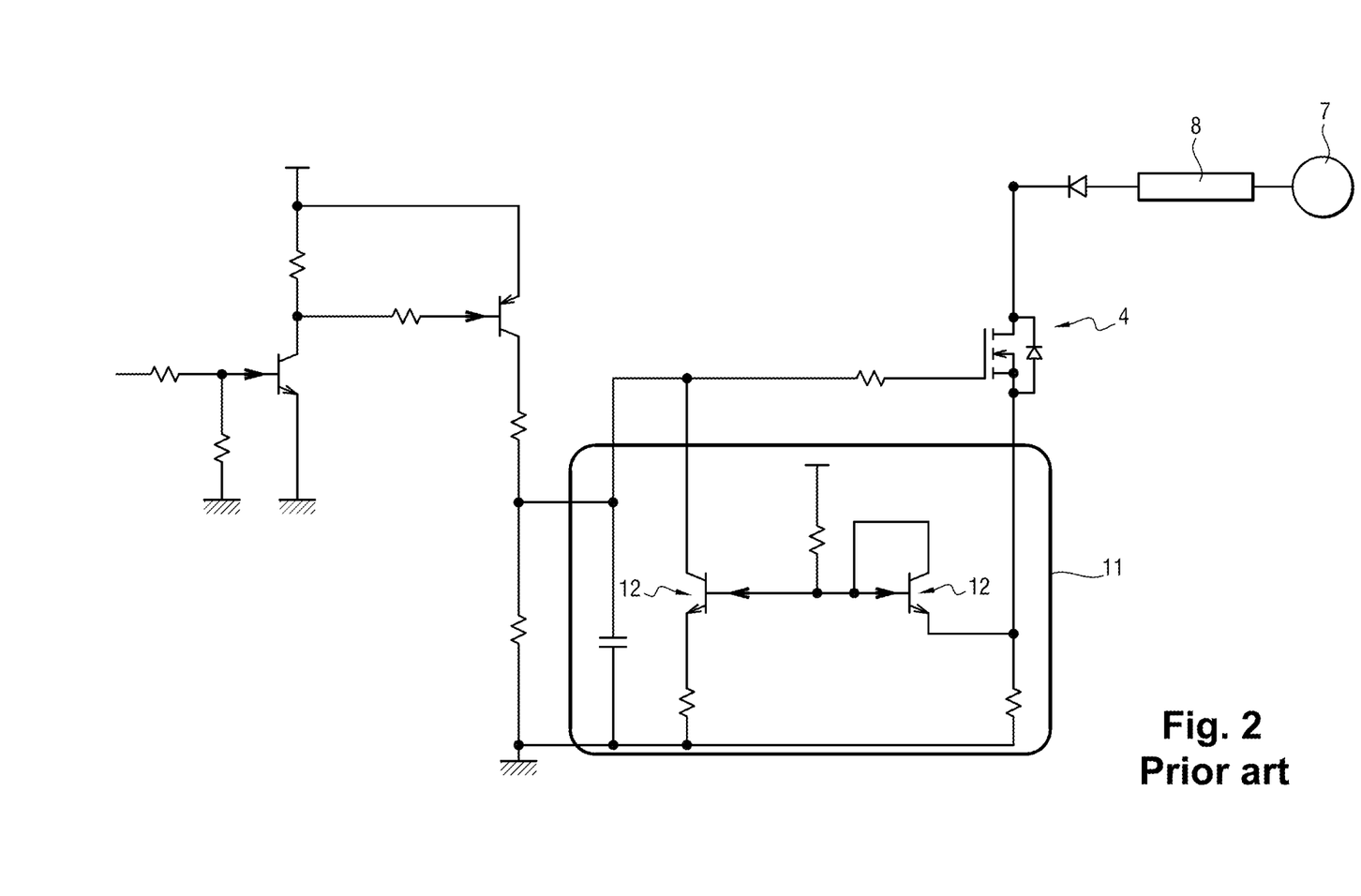
FIG. 2 shows a switching circuit and a limiter circuit in a second prior art solution.

With reference to FIG. 2, proposals have been made to improve the accuracy of current limiting by using a circuit 11 of the "current mirror" type. The accuracy that is obtained is then of the order of ±25%. That second solution requires the use of two paired transistors 12 located in the same package. The components used are therefore less conventional and can become obsolescent. The second solution is also relatively complicated to design and to manufacture.

SUMMARY OF THE INVENTION

In order to achieve this object, there is provided a monitor circuit for monitoring a lightning protection component, comprising:
generation components arranged
to generate a test voltage greater than a limit voltage of the lightning protection component and to apply the test voltage to terminals of the lightning protection component,
to compare a resulting voltage across the terminals of the lightning protection component with the limit voltage, and to detect a failure of the lightning protection component when the resulting voltage is greater than the limit voltage;
servocontrol components arranged to servocontrol the resulting voltage across the terminals of the lightning protection component so as to ensure that the resulting voltage does not exceed a predetermined maximum voltage threshold, the servocontrol components comprising:
a first transistor,
a monitor resistance,
and a drive component, the drive component being arranged to generate a control voltage for controlling the first transistor and to acquire a monitor voltage across the terminals of the monitor resistor, a pulse width modulation signal generator being programmed in the drive component to generate the control voltage.

The monitor circuit allows to detect a failure of the lightning protection component, and to ensure that the resulting voltage across the terminals of the lightning protection component is not too great during the test, and that it is not capable of destroying components of the calculation means.

Other characteristics and advantages of the invention appear on reading the following description of particular, nonlimiting embodiments of the invention.

BRIEF DESCRIPTION OF THE DRAWINGS

Reference is made to the accompanying drawings, in which.

DETAILED DESCRIPTION OF THE INVENTION

Figure 3:
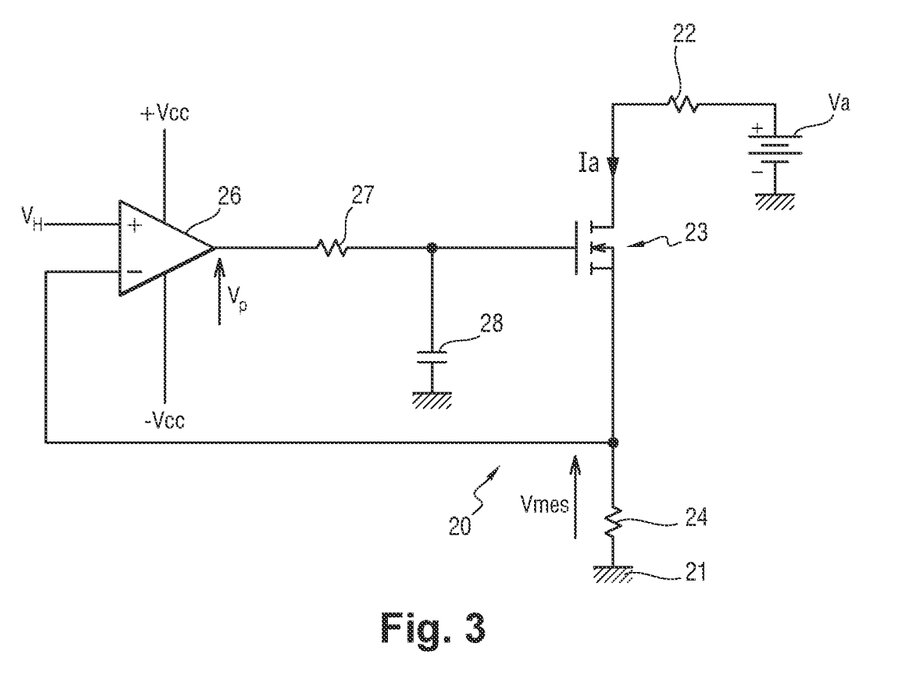
FIG. 3 shows a switching circuit in a first embodiment of the invention.

With reference to FIG. 3, the description begins with the principle of a switching circuit 20 in a first embodiment of the invention.

The switching circuit 20 is located in calculation means incorporated in an on-board system of an aircraft.

The switching circuit 20 performs two functions that are normally performed by two distinct circuits, as described above.

The first function is a switching function. The switching circuit 20 is for switching a cold point of a load 22 to electrical ground 21, which load has a hot point that is connected to a power supply network.

In this example, the term "hot point" of a two-terminal component is used to mean the terminal that is at the higher potential, and the term "cold point" is used to mean the terminal that is at the lower potential.

The second function is a current limiter function. The switching circuit ensures that a power supply current Ia flowing through the load 22 does not exceed a predefined current threshold.

In this example, the load 22 is symbolized as a resistor. The power supply network supplies the power supply current Ia to the load 22 at a DC power supply voltage Va.

The switching circuit 20 comprises firstly a transistor 23 connected between the cold point of the load 22 and electrical ground 21. In this example, the transistor 23 is a power transistor of the MOSFET type.

The switching circuit 20 also includes a measuring resistor 24, referred to as a "shunt". The shunt 24 is connected between the transistor 23 and electrical ground 21. The shunt 24 has a hot point that is connected to a source of the transistor 23.

The voltage across the terminals of the shunt 24 is a measurement voltage Vmes proportional to the power supply current Ia.

The switching circuit 20 also includes a drive component serving both to control the transistor 23 and also to limit the power supply current Ia. In this example, the drive component is an operational amplifier 26.

An inverting input of the operational amplifier 26 is connected to the hot point of the shunt 24.

A control voltage $V_H$ is applied to a non-inverting input of the operational amplifier 26.

The control voltage $V_H$ forms a signal for connecting or disconnecting the cold point of the load 22 to or from electrical ground.

An output of the operational amplifier 26 is connected to a gate of the transistor 23 via a resistor 27 and a capacitor 28.

A drive voltage $V_p$ for the transistor 23 is generated at the output of the operational amplifier 26.

The switching circuit 20 operates in three modes of operation.

The first mode of operation is used when the load 22 is not to be powered. Under such circumstances, the operational amplifier 26 receives a negative control voltage $V_H$ on its non-inverting input. The negative control voltage $V_H$ is a disconnection signal.

The operational amplifier 26 operates as a comparator.

Since, whatever the state of the transistor 23, the inverting input, which is connected to the hot point of the shunt 24, cannot be negative, the operational amplifier 26 is put into negative saturation conditions.

The drive voltage $V_p$ at the output from the operational amplifier 26 is thus a negative saturation voltage, close to −Vcc, where +Vcc is the positive power supply voltage of the operational amplifier 26. Because of the negative saturation voltage applied to the gate of the transistor 23, the transistor is in a non-conductive state (open circuit). The power supply current Ia passing through the load 22 is thus zero.

When it is appropriate to power the load 22, the operational amplifier 26 receives a positive control voltage $V_H$ on its non-inverting input. The positive control voltage $V_H$ is a connection signal.

The positive control voltage $V_H$ is set at:

$$V_H = Ilim \cdot Rmes$$

where Rmes is the resistance of the shunt 24 and where Ilim is the predefined current threshold value.

The operational amplifier 26 causes the potential at its inverting input to match the control voltage $V_H$ applied to its non-inverting input. The drive voltage $V_p$ at the output from the operational amplifier 26 therefore increases until the transistor 23 is caused to be conductive. The transistor 23 then allows the power supply current Ia to flow through the load 22 and through the shunt 24.

Two situations are then possible.

When the impedance of the load 22 as seen by the power supply voltage Va is such that the power supply current Ia cannot reach the predefined current threshold (even with the transistor 23 under saturated conditions), then the voltage at the inverting input cannot reach the value of the control voltage $V_H$. The drive voltage $V_p$ at the output from the operational amplifier 26 then increases until it reaches a positive saturation voltage close to +Vcc. The operational amplifier 26 is then under positive saturation conditions. The transistor 23 is under saturated conditions. The switching circuit 20 is in a "closed-circuit" state that corresponds to a second mode of operation.

In contrast, when the impedance of the load 22 as seen by the power supply voltage Va is such that the power supply current Ia can reach and even exceed the predefined current threshold, the drive voltage $V_p$ output by the operational amplifier 26 increases only up to a conduction voltage. The conduction voltage corresponds to the transistor 23 becoming conductive, thereby enabling the power supply current Ia to reach the predefined current threshold. The measurement voltage Vmes across the terminals of the shunt 24, and thus the voltage at the inverting input of the operational amplifier 26, reaches the value of the control voltage $V_H$. The operational amplifier 26 is no longer under positive saturation conditions, but rather under linear conditions. The transistor 23 is under linear conditions. The switching circuit 20 is in a third mode of operation. In the third mode of operation, the measurement voltage Vmes is servocontrolled on the control voltage $V_H$. The power supply current Ia is thus regulated so that it does not exceed the predefined current threshold Ilim:

$$Ilim = V_H / Rmes.$$

The switching circuit 20 thus implements a regulation loop that regulates the power supply current Ia.

The switching circuit 20 presents certain advantages over the prior art.

The accuracy of the predefined current threshold depends mainly on the accuracy of the control voltage $V_H$ and on the resistance Rmes of the shunt 24, which are two parameters that are easily controlled. It is thus possible to obtain a relative error on the predefined current threshold of a few %.

Furthermore, in the limiter circuit 3 shown in FIG. 1, the resistance of the shunt 6 is constrained by the ratio Vbe/Ilim. The resistance required for the shunt 6 can thus be relatively large and can give rise to a voltage drop that is too great when the transistor 23 is in the closed-circuit state.

In the switching circuit 20, it is possible, for a given value of the predefined current threshold, to reduce the resistance of the shunt 24 by reducing the value of the control voltage $V_H$.

Furthermore, since the predefined current threshold is better controlled, the design power of the switching circuit 20 can be optimized. Specifically, in current-limiter mode, the maximum current that needs to be taken into account can be reduced by about 50% compared with the circuit of FIG. 1.

Furthermore, the switching circuit 20, which is very simple, performs both the switching function and also the limiter function. This greatly simplifies the calculation means that perform these functions.

Also, the components used are components that are conventional and generic, guaranteeing ease of supply without risk of obsolescence.

Figure 4:
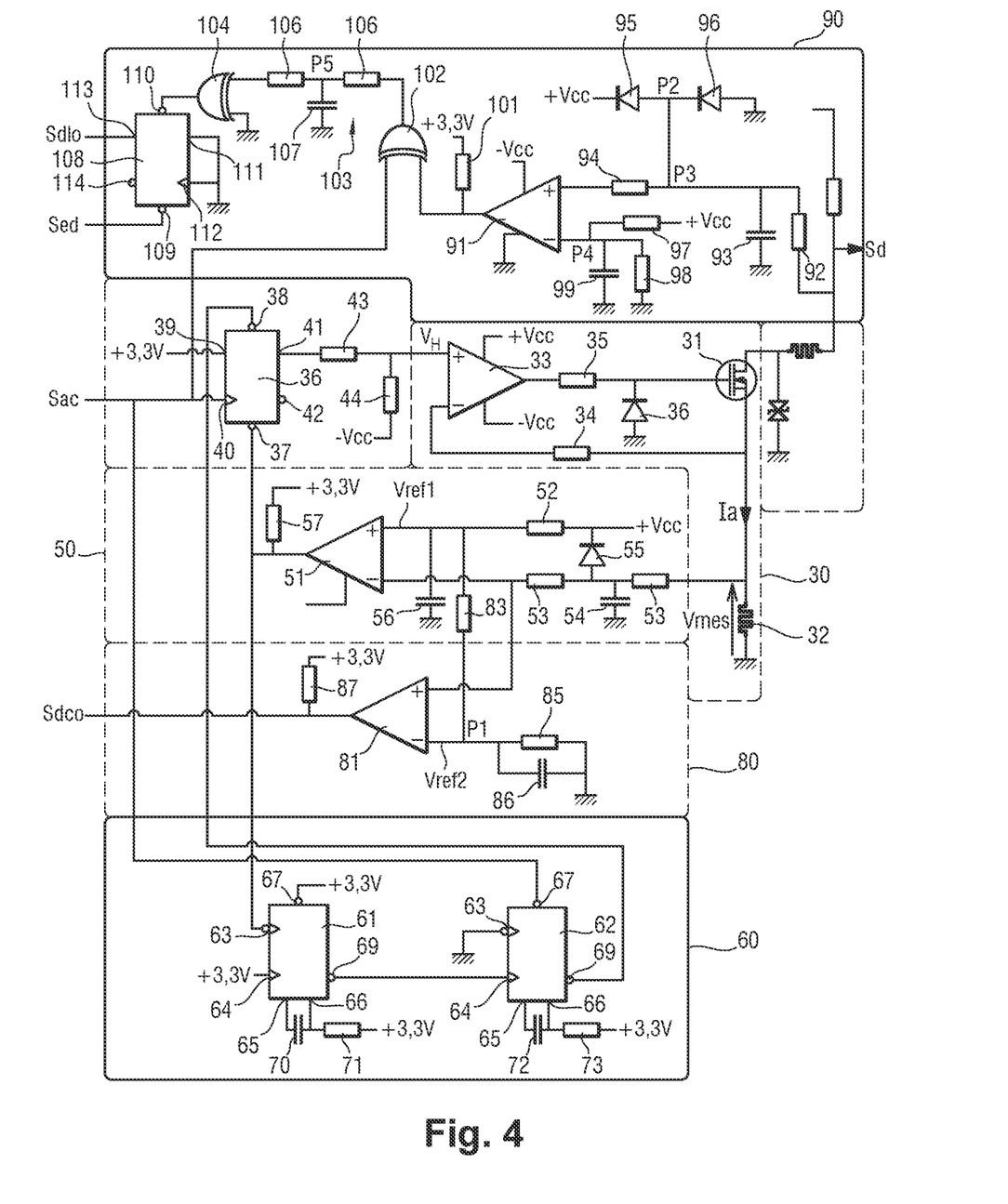
FIG. 4 shows the switching circuit of the first embodiment of the invention, associated with monitoring circuits performing various monitoring functions.

With reference to FIG. 4, there follows a description of a real implementation in calculation means of a switching circuit 30 in the first embodiment of the invention.

The calculation means include a discrete output Sd for connection to the cold point of the load that is to be powered. The switching circuit 30 is connected to the discrete output Sd.

The switching circuit 30 thus comprises a transistor 31 of MOSFET type, a shunt 32, and a first operational amplifier 33.

The inverting input of the first operational amplifier 33 is connected to the hot point of the shunt 32 via a resistor 34. The output of the first operational amplifier 33 is connected to the gate of the transistor 31 via a resistor 35 and a diode 36. The first operational amplifier 33 is powered by a positive power supply voltage +Vcc and by a negative power supply voltage −Vcc.

The switching circuit 30, and more precisely the first operational amplifier 33, is driven by a first D-type bistable 36. The first D-type bistable 36 has a reset input 37, a set input 38, a data input 39, a clock (CLK) input 40, a Q output 41, and a $\overline{Q}$ output 42.

The Q output 41 is connected by a resistor 43 to the non-inverting input of the first operational amplifier 33.

A voltage of +3.3 V, i.e. a high state, is continuously applied to the data input 39. The $\overline{Q}$ output 42 is not connected.

When the switching function is not activated for powering the load, a switching activation signal Sac is in the low state. The switching activation signal Sac is applied to the CLK input 40. The Q output 41 is in the low state.

The negative power supply voltage −Vcc acts via the resistor 44 to produce a negative control voltage $V_H$ on the non-inverting input of the first operational amplifier 33. The negative control voltage $V_H$ is a disconnection signal. The switching circuit 30 is in the first mode of operation.

When the switching function is activated to power the load, the switching activation signal Sac applied to the CLK input 40 is in the high state. The Q output 41 goes to the high state.

A positive control voltage $V_H$ is then applied to the non-inverting input of the first operational amplifier 33. The positive control voltage $V_H$ is a connection signal. The switching circuit 30 is in the second mode of operation or in the third mode of operation, depending on the impedance of the load and on the value of the power supply voltage powering the load.

The calculation means also include a disable circuit 50 that causes the transistor 31 to take up the non-conductive state in the event of excess current flowing in the load. The disable circuit 50 includes a second operational amplifier 51.

A non-inverting input of the second operational amplifier 51 is connected to the positive power supply voltage +Vcc via a resistor 52 and a capacitor 56.

The inverting input of the second operational amplifier 51 is connected to the hot point of the shunt 32 via two resistors 53 and a capacitor 54. A diode 55 is connected between the two resistors 53 and to the hot point of the resistor 52.

An output of the second operational amplifier 51 is connected to a voltage of +3.3 V via a resistor 57.

The output of the second operational amplifier 51 is also connected to the reset input 37 of the first D-type bistable 36.

The second operational amplifier 51 compares the measurement voltage Vmes across the terminals of the shunt 32 with a constant and positive first reference voltage Vref1 that is applied to the non-inverting input.

When the measurement voltage Vmes is greater than the first reference voltage Vref1, which means there is excess current, i.e. the power supply current Ia has a value that is too great and is therefore suspect, the output of the second operational amplifier 51 goes to a low state. The reset input 37 of the first D-type bistable 36 also goes to a low state, thereby causing the Q output 41 to go to a low state. The switching circuit 30 is then in the first mode of operation, and the load is no longer powered.

The calculation means also include an automatic re-enable circuit 60. Automatic re-enabling takes place after the disabling caused by the disable circuit 50. The automatic re-enable circuit 60 comprises a first monostable multivibrator 61 and a second monostable multivibrator 62. In this example, the first and second monostable multivibrators 61 and 62 are incorporated in a single component.

Each of the first and second monostable multivibrators 61 and 62 has an A input 63, a B input 64, a Cext input 65, an Rext input 66, a $\overline{CL}$ input 67, a Q output (that is not connected and not shown), and a $\overline{Q}$ output 69.

The A input 63 of the first monostable multivibrator 61 is connected to the reset input 37 of the first D-type bistable 36. A voltage of +3.3 V, i.e. a high state, is applied continuously to the B input 64 and to the $\overline{CL}$ input 67. A capacitor 70 is connected between the Cext input 65 and the Rext input 66. A voltage of +3.3 V is applied to the Rext input 66 via a resistor 71, and to the Cext input 65 via the resistor 71 and the capacitor 70.

The A input 63 of the second monostable multivibrator 62 is connected to electrical ground. The B input 64 is connected to the $\overline{Q}$ output 69 of the first monostable multivibrator 61. A capacitor 72 is connected between the Cext input 65 and the Rext input 66. A voltage of +3.3 V is applied to the Rext input 66 via a resistor 73, and to the Cext input 65 via the resistor 72 and the capacitor 73. The switching activation signal Sac is applied to the $\overline{CL}$ input 67. The $\overline{Q}$ output 69 is connected to the set input 38 of the first D-type bistable 36.

After the disabling caused by the disable circuit 50, the first monostable multivibrator 61 applies a blocking time before automatic re-enabling, and after the blocking time has elapsed, the second monostable multivibrator 62 generates a transition to a high state on its $\overline{Q}$ output 69. The transition to the high state is applied to the set input 38 of the first D-type bistable 36, thereby automatically re-enabling the switching circuit 30 after the blocking time.

The calculation means also include a monitor circuit 80 for monitoring an open circuit. This open-circuit monitor circuit 80 seeks to detect a power supply current Ia that is abnormally low while the switching function is activated, and thus to detect an open-circuit fault.

The open-circuit monitor circuit 80 for monitoring an open circuit includes a third operational amplifier 81. The non-inverting input of the third operational amplifier 81 is connected to the hot point of the shunt 32 via the two resistors 53 and the capacitor 54. An inverting input of the third operational amplifier 81 is connected to a point P1. The point P1 is connected via a resistor 83 and via the resistor 52 to the positive power supply voltage +Vcc. The point P1 is also connected to electrical ground via a resistor 85 and a capacitor 86 connected in parallel. A constant and positive second reference voltage Vref2 is thus applied to the inverting input. An output of the third operational amplifier 81 is connected to a voltage of +3.3 V via a resistor 87. The output of the third operational amplifier 81 produces an open-circuit fault signal Sdco.

When an open-circuit fault occurs, the measurement voltage Vmes across the terminals of the shunt 32 is abnormally low, since the power supply current Ia is abnormally low. The voltage at the non-inverting input of the third operational amplifier 81, which is an image of the measurement voltage Vmes, is thus less than the second reference voltage Vref2. The output of the third operational amplifier 81 is then in a low state, thereby enabling the calculation means to detect an open-circuit fault.

The calculation means further include a monitor and record circuit 90 for monitoring and recording the state of the discrete output Sd. The monitor and record circuit 90 seeks to monitor consistency between the state of the discrete output Sd and the switching activation signal Sac of the switching circuit 30.

The monitor and record circuit 90 comprises firstly a fourth operational amplifier 91. It should be observed that the second operational amplifier 51, the third operational amplifier 81, and the fourth operational amplifier 91 are all incorporated in the same component.

A non-inverting input of the fourth operational amplifier 91 is connected to the discrete output Sd via a resistor 92 and a capacitor 93 connected in parallel, and via a resistor 94. Two same-polarity diodes 95 and 96 are connected in series. The cathode of the diode 95 is connected to the positive power supply voltage +Vcc. The anode of the diode 96 is connected to electrical ground. A point P2 situated between the two diodes 95 and 96 is connected to a point P3 situated between the resistor 94 and the resistor 92.

An inverting input of the fourth operational amplifier 91 is connected to a point P4. The point P4 is connected to the positive power supply voltage +Vcc via a resistor 97, and to electrical ground via a resistor 98 and a capacitor 99 connected in parallel.

The output of the fourth operational amplifier 91 is connected to a voltage of +3.3 V via a resistor 101.

The fourth operational amplifier 91 is powered solely by a negative voltage −Vcc.

The output of the fourth operational amplifier 91 is also connected to a first input of a first exclusive-OR (XOR) gate 102. The switching activation signal Sac is applied to the second input of the first XOR gate 102.

An output of the first XOR gate 102 is connected via a lowpass filter 103 to a first input of a second XOR gate 104. A second input of the second XOR gate 104 is connected to electrical ground. The lowpass filter 103 comprises two resistors 106 and a capacitor 107. The capacitor 107 has one terminal connected to electrical ground and another terminal connected to a point P5 situated between the resistors 106.

The monitor and record circuit 90 also includes a second D-type bistable 108. The first D-type bistable 36 and the second D-type bistable 108 are incorporated in the same component. The second D-type bistable 108 has a reset input 109, a set input 110, a data input 111, a CLK input 112, a Q output 113, and a $\overline{Q}$ output 114.

The data input 111 and the CLK input 112 are connected to electrical ground. The $\overline{Q}$ output 114 is not connected. The set output 110 is connected to an output of the second XOR gate 104. An open-line fault signal Sdlo is produced on the Q output 113. When the Q output 113 is in the high state, an open-line fault has been detected. When the open-line fault is corrected, a fault cleared signal Sed is applied to the reset input 109.

When the switching function is activated and the line is not faulty, the potential at the discrete output Sd of the calculation means is relatively high. The first input of the first XOR gate 102 and the second input of the first XOR gate 102 are thus both in a high state, and thus the output of the first XOR gate 102 is in a low state. The output of the second XOR gate 104 is also in a low state. The Q output 113 of the second D-type bistable 108 is then in a low state, which means that no open-line fault is being detected.

In contrast, when the switching function is activated and the line is faulty, the potential at the discrete output Sd of the calculation means is relatively low. The first input of the first XOR gate 102 is in a low state and the second input of the first XOR gate 102 is in a high state, and thus the output of the first XOR gate 102 is in a high state. The output of the second XOR gate 104 is also in a high state. The Q output 113 of the second D-type bistable 108 is then in a high state, which means that an open-line fault is being detected.

The lowpass filter 103 and using the second XOR gate 104 serve to eliminate transients, i.e. specifically, erroneous detection of open-line faults due to fast transient variations in the voltage at the discrete output Sd of the calculation means.

Figure 5:
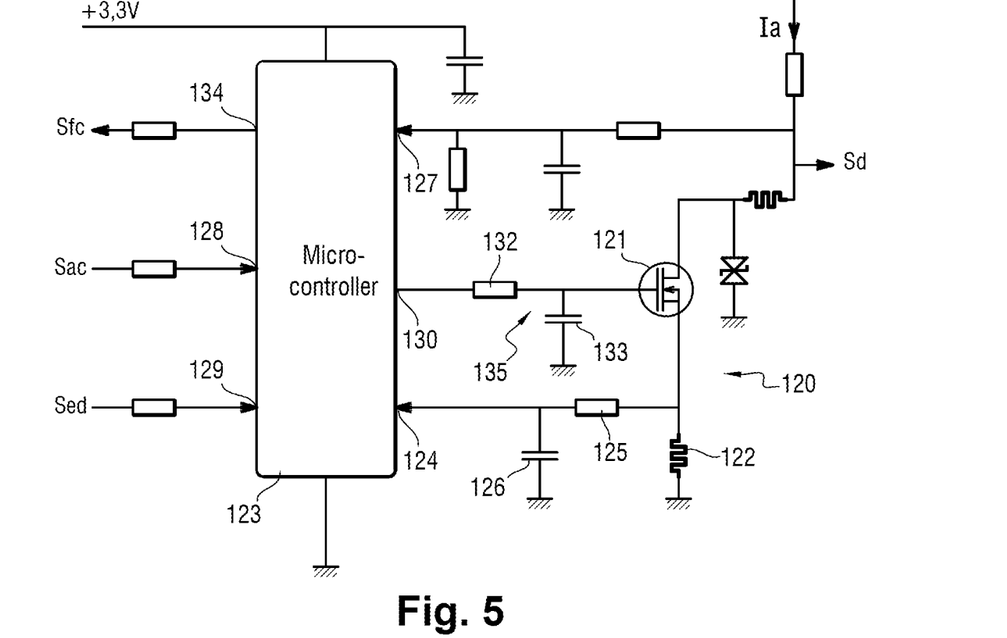
FIG. 5 shows a switching circuit in a second embodiment of the invention.
Figure 6:
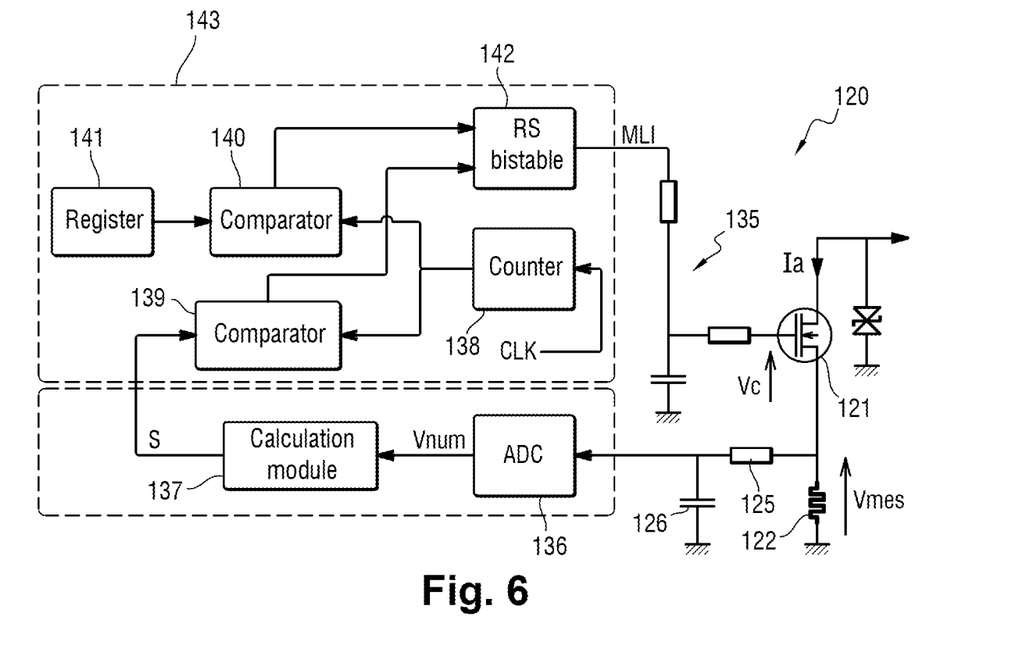
FIG. 6 shows a first pulse width modulation (PWM) signal generator.

With reference to FIGS. 5 and 6, there follows a description of a switching circuit 120 in a second embodiment of the invention.

Once again, the switching circuit 120 comprises a MOSFET type power transistor 121 and a shunt 122.

The switching circuit 120 also includes a drive component serving both to control the transistor 121 and to limit the power supply current Ia. The drive component is a programmable digital component. In this example, the drive component is a microcontroller 123, however it could be some other component, e.g. a field programmable gate array (FPGA), a processor, an application specific integrated circuit (ASIC), etc.

In addition to its calculation functions, the microcontroller 123 includes all of the necessary memory (random access memory (RAM), flash memory, and electrically erasable programmable read-only memory (EEPROM)), interfaces (analog to digital converter (ADC), series connection, discrete outputs, etc.), and sequencing functions (time base, timers, watchdog, etc.).

The microcontroller 123 possesses an input 124 connected to the hot point of the shunt 122 via a lowpass filter comprising a resistor 125 and a capacitor 126. The microcontroller 123 also possesses an input 127 connected to the discrete output Sd, itself connected to the cold point of the load that is to be powered, an input 128 that receives the switching activation signal Sac for activating the switching function, and an input 129 that receives the fault cleared signal Sed.

The microcontroller 123 possesses an output 130 connected to the gate of the transistor 121 via a lowpass filter 135 comprising a resistor 132 and a capacitor 133, together with an output 134 supplying a status for the switching function Sfc.

The microcontroller 123 is powered by a voltage of +3.3 V.

Implementation of the switching circuit 120 makes use of an ADC 136, a calculation module 137, a counter 138, a first comparator 139, a second comparator 140, a register 141, and an RS bistable 142. The counter 138 is a 10-bit counter and the register 141 contains data with a size of 10 bits.

The ADC 136 acquires the measurement voltage Vmes, and produces a digital measurement voltage Vnum on 10 bits.

On the basis of the digital measurement voltage Vnum, the calculation module 137 produces a digital error signal S on 10 bits.

The digital error signal S is such that:

$$S=1023-(Vnum-C)*G.$$

In this formula, 1023 corresponds to the full scale of analog to digital encoding on 10 bits. The digital error signal S is thus centered in the dynamic range of the digital output signal from the ADC 136.

In this formula, C is a voltage setpoint value corresponding to a setpoint for power supply current Ia equal to the predefined current threshold. G is a gain that amplifies the difference between the digital measurement voltage Vnum and the voltage setpoint C.

In this example, C=205 (which corresponds to a voltage setpoint of 1 V for Vmes) and G=8, and thus:

$$S=1023-(Vnum-205)*8.$$

The output from the calculation module 137, on 10 bits, is connected to a first input of the first comparator 139.

The counter 138 receives a clock signal CLK and counts the rising fronts in the clock signal CLK. The counter 138 forms a register of digital values representative of a ramp forming a triangular function.

The output from the counter 138 is connected to a second input of the first comparator 139.

When the digital error signal S is equal to the numerical value of the counter 138, the output of the first comparator 139 goes to a high state.

The output of the first comparator 139 is connected to an S input of the RS bistable 142. Thus, when the digital error signal S is equal to the numerical value of the counter 138, a Q output of the bistable 142 changes state. The RS bistable 142 is returned to its initial state at the end of the ramp.

The first comparator 139, the counter 138, and the RS bistable 142 thus form a first PWM signal generator 143 that is programmed in the microcontroller 123. The PWM signal is produced at the Q output of the bistable 142. The duty ratio of the PWM signal depends on the digital error signal S.

The lowpass filter 135 produces a DC control voltage Vc equal to an average of the PWM signal. The DC control voltage Vc is applied to the gate of the transistor 121.

The lowpass filter 135 thus performs two functions. The lowpass filter 135 filters the PWM signal so as to produce the DC control voltage Vc. The lowpass filter 135 guarantees stability for the regulation loop by producing a first order cut-off at a frequency that is low enough to ensure that the regulation loop no longer has enough gain to be unstable when the phase rotation is sufficient.

It should be observed that in this example the register 141 contains the hexadecimal value FF. This value, which is compared by the second comparator 140 with the output from the counter 138, conditions the maximum frequency of the PWM signal. This value may be modified dynamically depending on the operating conditions of the switching circuit 120.

The above-described three modes of operation apply once again.

The first mode of operation is used when the load is not to be powered. Under such circumstances, the switching activation signal Sac is such that the switching function is not activated. The output of the RS bistable 142 is in a low state, and the transistor 121 is in a non-conductive state.

In the second mode of operation, the load is to be powered. The switching activation signal Sac is such that the switching function is activated. In the second mode of operation, the load is such that the power supply current Ia cannot reach the predefined current threshold. Under such circumstances, the DC control voltage Vc is such that the transistor 121 is under saturated conditions.

In the third mode of operation, the load is to be powered. The switching activation signal Sac is such that the switching function is activated. In the third mode of operation, the load is such that the power supply current Ia can reach the predefined current threshold. Under such circumstances, the DC control voltage Vc is such that the transistor 121 is under linear conditions.

In addition to performing the switching function and the limiter function, the microcontroller 123 acts digitally to operate and drive all of the above-described circuits: the disable circuit 50, the automatic re-enable circuit 60, the open-circuit monitor circuit 80, the monitor and record circuit 90.

Using the microcontroller 123 makes it possible to perform all of the above-described functions, and their settings can easily be determined by software configuration. The solution using the microcontroller 123 is thus more compact, with simpler hardware, than is the discrete solution of the first embodiment of the invention. Recurrent cost is also minimized, since a microcontroller 123 (or any other programmable digital component) is a component of very low cost.

Figure 7:
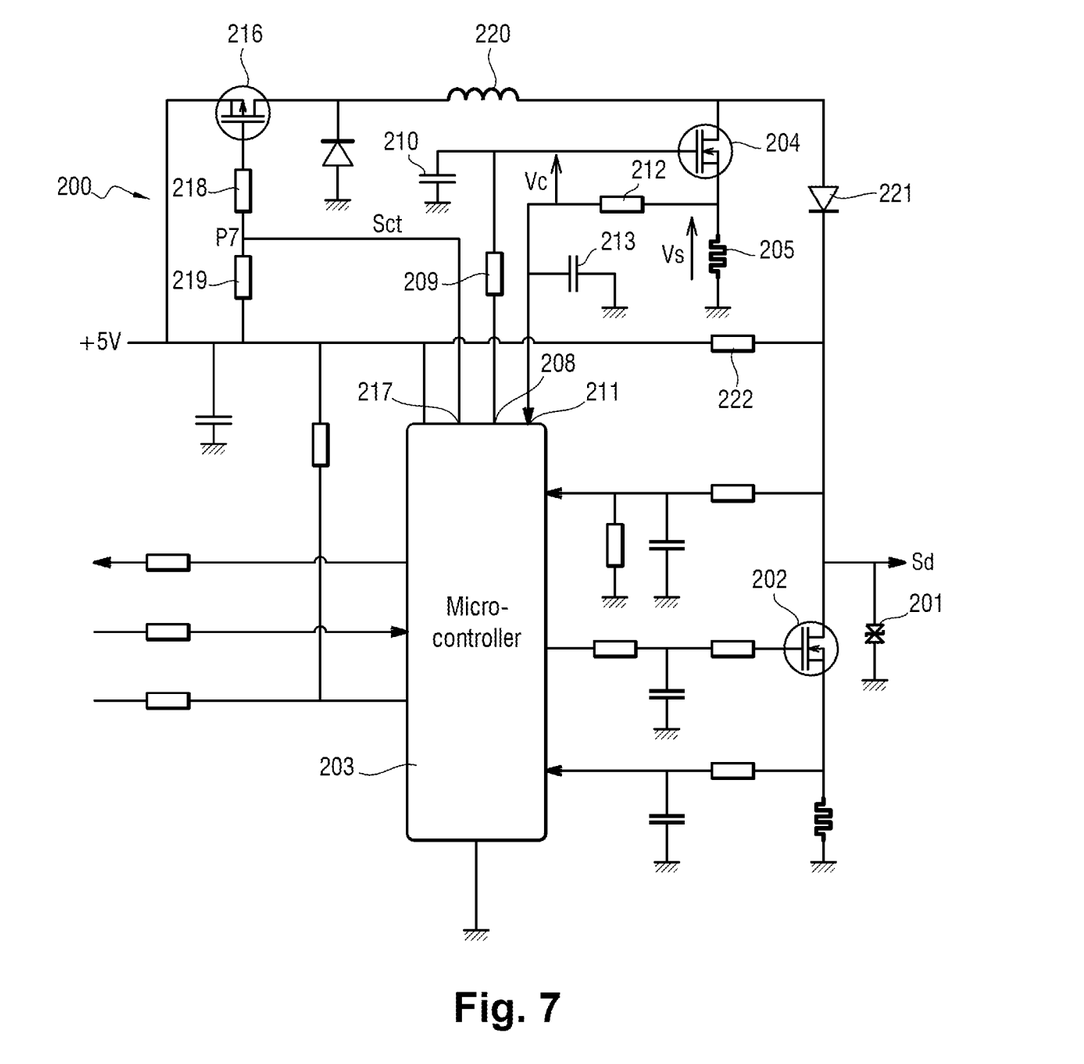
FIG. 7 shows a monitor circuit for monitoring a lightning protection component (or "arrester")
Figure 8:
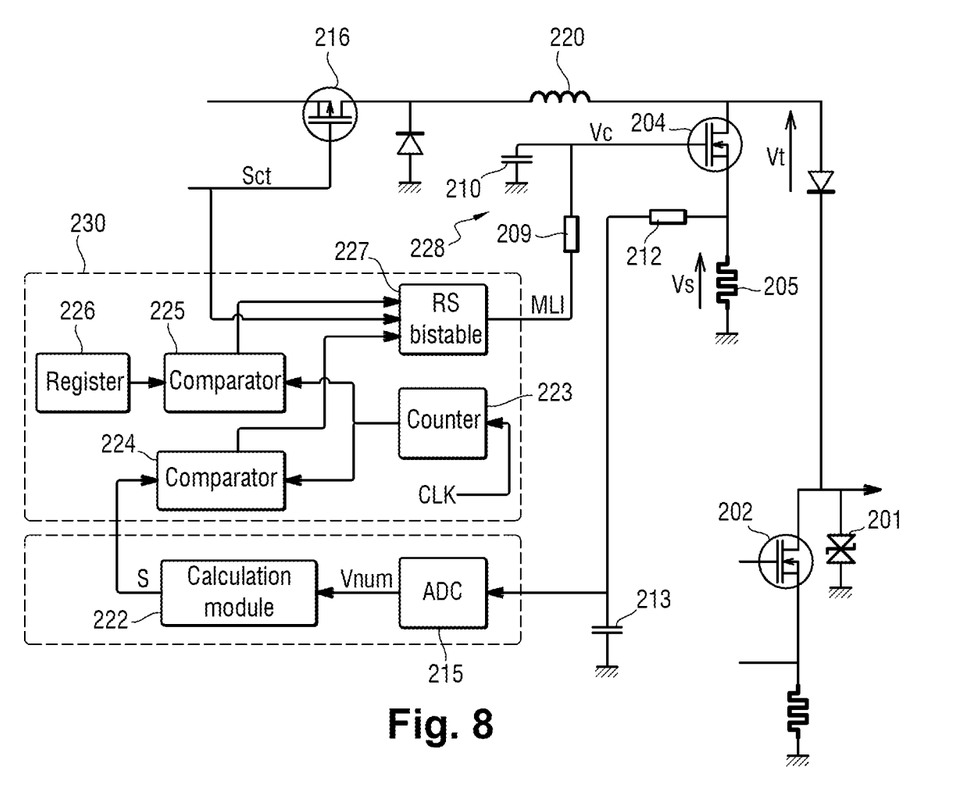
FIG. 8 shows a second PWM signal generator.
Figure 9:
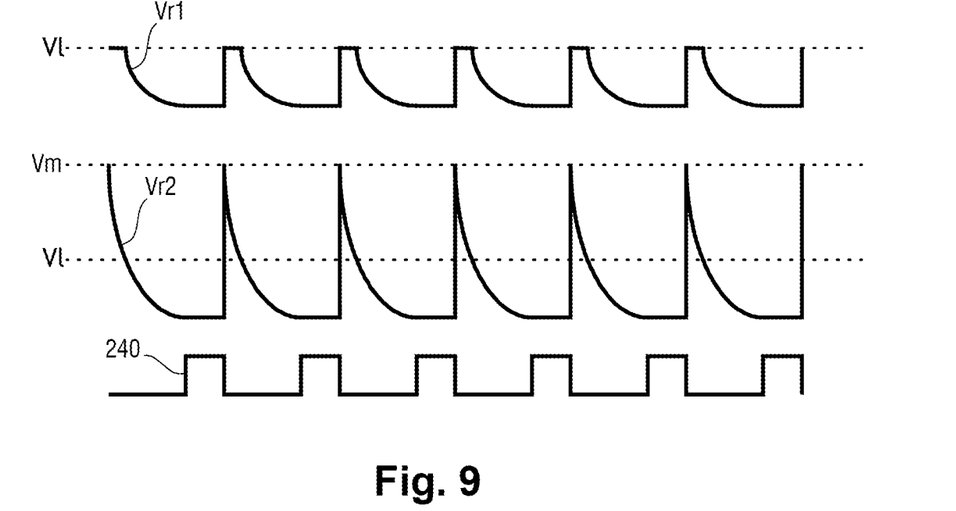
FIG. 9 comprises three graphs showing the operation of the monitor circuit for monitoring the lightning protection component.

Advantageously, and with reference to FIGS. 7 to 9, use is also made of a monitor circuit 200 for monitoring a lightning protection component.

In this example, the protection component is a transient voltage suppression (TVS) diode 201. The TVS diode 201 has one terminal that is connected to the drain of the transistor 202 of the switching circuit, and another terminal that is connected to electrical ground.

The failure that is to be detected by the monitor circuit 200 is a failure in "cut-off" mode: the TVS diode 201 then forms an open circuit.

The monitor circuit 200 is driven by a drive component, specifically by a microcontroller 203 that also drives the switching circuit together with all of the above-described circuits. The microcontroller 203 has inputs and outputs similar to those of the microcontroller 123.

The monitor circuit 200 comprises a first transistor 204 and a monitor resistor 205. The first transistor 204 is an N-channel MOSFET type transistor.

The monitor resistor 205 is connected between the first transistor 204 and electrical ground. A monitor output 208 of the microcontroller 203 is connected to the gate of the first transistor 204 via a resistor 209 and a capacitor 210 connected in parallel. Via a resistor 212 and a capacitor 213 connected in parallel, a measurement input 211 of the microcontroller 203 acquires a monitor voltage Vs across the terminals of the monitor resistor 205.

An ADC 215 incorporated in the microcontroller 203 measures and digitizes the monitor voltage Vs.

The monitor circuit 200 also comprises a second transistor 216, which is of P-channel MOSFET type. A control output 217 of the microcontroller 203 is connected to a point P7. The point P7 is situated between a resistor 218 and a resistor 219. The resistor 218 is connected to the gate of the second transistor 216. The source of the second transistor 216 is connected to a voltage of +5V. The drain of the second transistor 216 is connected to a first terminal of an inductor 220. The second terminal of the inductor 220 is connected to the drain of the first transistor 204. The drain of the first transistor 204 is also connected to the anode of a diode 221 having its cathode connected to the discrete output Sd of the calculation means and to the TVS diode 201. The cathode of the diode 221 is also connected to the +5V voltage via a resistor 222.

When it is appropriate to test the TVS diode 201, the monitor circuit 200 operates on the principle of generating a test voltage Vt greater than a limit voltage of the TVS diode 201 and of applying the test voltage Vt to the terminals of the TVS diode 201. The resulting voltage across the terminals of the TVS diode 201 is then compared with the limit voltage of the TVS diode 201, and a failure of the TVS diode 201 is detected when the resulting voltage is greater than the limit voltage.

Nevertheless, it is appropriate to ensure that the resulting voltage across the terminals of the TVS diode 201 is not too great, and that it is not capable of destroying components of the calculation means, and in particular components of the switching circuit (including the microcontroller 203).

In order to generate the test voltage Vt, the monitor circuit 200 includes voltage-raising means arranged to generate the test voltage Vt and to apply the test voltage selectively to the terminals of the TVS diode 201.

The voltage-raising means comprise the second transistor 216 and the inductor 220. The test voltage Vt is applied to the TVS diode 201 via the diode 221.

When it is appropriate to generate a test voltage Vt, a test control signal Sct is applied the gate of the second transistor 216.

The monitor circuit 200 also includes servocontrol means arranged to servocontrol the resulting voltage across the terminals of the TVS diode 201 so as to ensure that the resulting voltage does not exceed a predetermined maximum voltage threshold. This ensures that the resulting voltage is not capable of destroying components of the calculation means.

The servocontrol means comprise the first transistor 204, the monitor resistor 205, and the microcontroller 203.

The microcontroller 203 is for generating a control voltage Vc for controlling the first transistor 204 and for servocontrolling a monitor voltage Vs across the terminals of the monitor resistor 205 on the control voltage Vc.

Operation of the monitor circuit 200 makes use of the ADC 215 of the microcontroller 203, of a calculation module 222, of a counter 223, of a first comparator 224, of a second comparator 225, of a register 226, and of an RS bistable 227.

The ADC 215 acquires the monitor voltage Vs, and produces a digital monitor voltage Vnum on 10 bits.

On the basis of the digital measurement voltage Vnum and of the predetermined maximum voltage threshold, the calculation module 222 produces a digital error signal S on 10 bits.

The digital error signal S is such that:

$$S=1023-(Vnum-C)*G.$$

In this formula, 1023 corresponds to the full scale of analog to digital encoding on 10 bits. The digital error signal S is thus centered in the dynamic range of the digital output signal from the ADC 215.

In this formula, C is a voltage setpoint value corresponding to a current setpoint. G is a gain that amplifies the difference between the digital measurement voltage Vnum and the voltage setpoint.

The first comparator 224, the counter 223, and the RS bistable 227 form a second PWM signal generator 230 that is programmed in the microcontroller 203.

The second PWM signal generator 230 operates in similar manner to the above-described first PWM signal generator 143.

A lowpass filter 228, formed by the resistor 209 and the capacitor 210, produces a DC control voltage Vc equal to an average of the PWM signal. The DC control voltage Vc is applied to the gate of the first transistor 204.

The test control signal Sct is also applied as input to the RS bistable 227. The test control signal Sct thus enables generation of the PWM signal and thus of the DC control voltage Vc.

It should be observed that this time the register 226 contains the hexadecimal value 17.

With reference to FIG. 9, when the test control signal Sct is in a high state, the second PWM signal generator 230 creates a square wave signal 240 presenting a certain period and a certain duty cycle.

Each high state of the square wave signal makes the first transistor 204 conductive. The test voltage Vt is then generated by the voltage-raising means. When the square wave signal 209 returns to the low state, the first transistor 204 goes to a non-conductive mode and the test voltage Vt collapses down to zero, until the next high state of the square wave signal 240.

When the TVS diode 201 is functional, the resulting voltage Vr1 is limited by a limit voltage V of the TVS diode 201.

When the TVS diode 201 is faulty and constitutes an open circuit, the resulting voltage Vr2 can rise to a maximum value that is much higher. The maximum value is nevertheless limited to the predetermined maximum voltage threshold Vm.

The resulting voltage Vr2 is regulated on the predetermined maximum voltage threshold Vm by the second PWM signal generator 230. The above-mentioned current setpoint value C is thus defined as a function of the predetermined maximum voltage threshold Vm and of the resistance of the monitor resistor 205.

The monitor circuit 200 includes a detector means arranged to compare the resulting voltage across the terminals of the TVS diode 201 with the limit voltage V of the TVS diode 201, and to detect a failure of the TVS diode 201 when the resulting voltage is greater than the limit voltage V. The detector means are implemented in the microcontroller 203.

When the resulting voltage Vr2 reaches the predetermined maximum voltage threshold Vm, the detector means of the microcontroller 203 detect that the resulting voltage Vr2 is greater than the limit voltage V1, and thus detect that the TVS diode 201 forms an open circuit and has failed.

It should be observed that the behavior of this monitor function depends on the user load. It is therefore preferable to perform monitoring when no load is connected to the discrete output of the calculation means, which generally corresponds to stages of manufacture and of verification prior to putting the calculation means into service. Even if it is found to be necessary to limit performance of the monitor function to such stages only, the monitor function nevertheless remains very advantageous for reducing manufacturing costs and maintenance costs under operational conditions.

Naturally, the invention is not limited to the embodiments described, but covers any variant coming within the ambit of the invention as defined by the claims. All of the above-described circuits and all of the above-described functions may be implemented in digital manner or in analog manner.

The invention claimed is:

1. A monitor circuit for monitoring a lightning protection component, comprising:
    generation components arranged to:
        generate a test voltage greater than a limit voltage of the lightning protection component and to apply the test voltage to terminals of the lightning protection component;
        compare a resulting voltage across the terminals of the lightning protection component with the limit voltage; and
        detect a failure of the lightning protection component when the resulting voltage is greater than the limit voltage;
    servocontrol components arranged to servocontrol the resulting voltage across the terminals of the lightning protection component so as to ensure that the resulting voltage does not exceed a predetermined maximum voltage threshold, the servocontrol components comprising:
        a first transistors;
        a monitor resistor; and
        a drive component, the drive component being arranged to generate a control voltage for controlling the first transistor and to acquire a monitor voltage across the terminals of the monitor resistor, a pulse width modulation signal generator being programmed in the drive component to generate the control voltage.

2. The monitor circuit according to claim 1, wherein the pulse width modulation signal generator comprises a comparator, a counter, and an RS bistable, an output of the RS bistable being connected via a lowpass filter to a gate of the first transistor.

3. The monitor circuit according to claim 1, the drive component being a microcontroller.

4. The monitor circuit according to claim 1, wherein a drain of the first transistor is connected to the anode of a diode having its cathode connected to the lightning protection component.

5. The monitor circuit according to claim 1, wherein the generation components comprise voltage-raising components arranged to generate the test voltage and to apply the test voltage selectively to the terminals of the lightning protection component, the voltage-raising components comprising a second transistor and an inductor which is connected to a drain of the first transistor.

6. The monitor circuit according to claim 1, wherein the lightning protection component is a TVS diode.

7. Calculation means including a monitor circuit according to claim 1.

* * * * *